(12) United States Patent
Day et al.

(10) Patent No.: US 6,596,384 B1
(45) Date of Patent: Jul. 22, 2003

(54) SELECTIVELY ROUGHENING CONDUCTORS FOR HIGH FREQUENCY PRINTED WIRING BOARDS

(75) Inventors: Richard Allen Day, Whitney Point, NY (US); Kevin Taylor Knadle, Endicott, NY (US); Kristen Ann Stauffer, Vestal, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/119,458

(22) Filed: Apr. 9, 2002

(51) Int. Cl.[7] .................................................. B32B 3/00
(52) U.S. Cl. ...................... 428/212; 428/209; 174/250; 174/266
(58) Field of Search ................................ 428/209, 212; 174/250, 255, 260

(56) References Cited

U.S. PATENT DOCUMENTS

| | | | |
|---|---|---|---|
| 4,970,107 A | * 11/1990 | Akahoshi et al. | 428/209 |
| 5,021,296 A | * 6/1991 | Suzuki et al. | 428/409 |
| 5,049,221 A | 9/1991 | Wada et al. | 156/151 |
| 5,472,563 A | 12/1995 | Kogawa et al. | 156/629.1 |
| 5,679,230 A | * 10/1997 | Fatcheric et al. | 205/50 |
| 5,690,837 A | 11/1997 | Nakaso et al. | 216/17 |
| 5,830,563 A | 11/1998 | Shimoto et al. | 428/209 |
| 5,858,517 A | 1/1999 | Tagusari et al. | 428/209 |
| 5,879,568 A | 3/1999 | Urasaki et al. | 216/18 |
| 5,965,245 A | 10/1999 | Okano et al. | 428/209 |
| 5,976,762 A | 11/1999 | Takayanagi | 430/271.1 |
| 6,038,133 A | 3/2000 | Nakatani et al. | 361/760 |
| 6,204,454 B1 | 3/2001 | Gotoh et al. | 174/255 |
| 6,242,078 B1 | 6/2001 | Pommer et al. | 428/209 |
| 6,251,502 B1 | 6/2001 | Yasue et al. | 428/209 |
| 6,291,081 B1 | * 9/2001 | Kurabe et al. | 428/606 |
| 6,372,113 B2 | * 4/2002 | Yates et al. | 205/111 |
| 6,459,047 B1 | * 10/2002 | Japp et al. | 174/256 |

* cited by examiner

*Primary Examiner*—Cathy Lam
(74) *Attorney, Agent, or Firm*—William N. Hogg

(57) ABSTRACT

A printed wiring board is formed from two or more layers, one of which has circuit lines formed thereon, and wherein the surfaces of the circuit lines are roughened only in areas that require good copper to laminate adhesion. The remainder of the circuit line surfaces are smooth. Thus, those areas for propagation of the signal on signal lines have the circuit lines smooth to maximize the signal propagation effect, while those areas where the signal propagation is not critical are rough, which improves the adhesion of one layer to another. On the voltage planes, the surface in those regions opposite the smooth surfaces of the signal planes is smooth. Thus, these areas of the voltage planes can be maintained smooth while the other areas of the surface of the voltage planes can be roughened, providing good adhesion to the adjoining dielectric material.

9 Claims, 2 Drawing Sheets

SELECTIVELY ROUGHENING CONDUCTORS FOR HIGH FREQUENCY PRINTED WIRING BOARDS

BACKGROUND INFORMATION

Field of the Invention

This invention relates generally to printed wiring boards and, more particularly, to a technique and the resultant product for forming printed wiring boards wherein the technique includes laminating at least two layers together to form the printed wiring board.

BACKGROUND OF THE INVENTION

High frequency applications in the field of printed wiring boards, i.e. one GHz and above, are driving the need for smooth copper features on the surfaces of the signal lines. This need is due to the so-called skin effect where, as frequency increases, the path of the electrical signal tends toward the outer surface of the conductor. Hence, roughness on the surface of the copper in high frequency applications will result in higher surface resistivity and longer effective line length, both of which contribute to higher conductive losses for the signal. Also, signal integrity can be affected by the roughness in the ground or voltage planes that are referenced by a signal line in a composite board structure.

However, conventional printed wiring board processes, such as lamination, depend on roughened copper surfaces in order to provide adequate adhesion of the copper to dielectric laminate in the composite laminated structure. Typically, the exposed surfaces of internal wiring planes and voltage planes of a layer prior to lamination are initially smooth, and then are roughened to promote adhesion. Techniques for roughening the copper include the oxide and oxide replacement processes, as well as the application of brass, or zinc and/or nickel on the copper surface. Conventionally, the roughening treatment is applied to all the exposed copper surfaces prior to, as well as after, personalization of the copper plane. Thus, the two competing problems require different surface roughnesses for optimum benefit; i.e., a very smooth surface of the conductive material is desired for a most efficient signal propagation, while a roughened surface is desired for optimum adhesion of copper to the dielectric material.

SUMMARY OF THE INVENTION

It has been found that roughening of the conductors on the printed wiring board structure is critical only in certain regions and not required for the entire length of each of the circuit traces or signal lines. In fact, the mechanical and chemical exposures are greatest where a signal or power plane intersect a plated through hole. Therefore, the need is greater for good copper to laminate adhesion at this intersection than in the open, non-drilled areas of the board. Thus, according to the present invention, a printed wiring board is formed from two or more layers, one of which has circuit lines formed thereon, and wherein the surfaces of the circuit lines or traces are selectively roughened only in those areas that require very good copper to laminate adhesion, whereas the remainder of the surface of the circuit lines or traces are maintained in essentially a smooth condition. This provides a good solution to the conflicting needs for good adhesion and good signal propagation qualities since there is only a limited or relatively small area that requires very good adhesion, and these areas are generally so small that they do not materially affect the propagation of the signals on the signal lines. Thus, those critical areas for propagation of the signal on signal lines or traces can have the circuit lines or traces smooth to maximize the signal propagation effect, while those limited areas where the signal propagation is not critical can be roughened so as to improve the adhesion of one layer to another. Therefore, in the resulting board, adequate adhesion can be obtained while still providing a significantly better signal propagation than is possible with the roughened conductor surface.

It has also been found that on the voltage planes (including power and ground planes) smoothing the surface of the voltage plane in those regions opposite the smooth surface regions of the signal planes improves the performance of the signal propagation. Thus, these limited areas of the voltage planes can be maintained smooth while the other areas of the surface of the voltage planes can be roughened, which provides the necessary adhesion of the voltage plane to the adjoining layer of dielectric material between the voltage plane and the signal plane.

In the case of both signal and voltage planes, the application of selective roughening is not necessarily dictated solely by the location of signal lines and plated through holes, but can be customized for a specific board design by balancing the electrical signal performance characteristics and mechanical requirements of that board. For example, one design may require smooth conductors on every signal line and the respective area of the reference planes, another design may prescribe smooth conductors on the signal lines only and not the reference planes, while still another may have only a few select number of signal lines requiring smooth conductors for optimum electrical performance, allowing all other conductors roughened for maximum mechanical adhesion.

DESCRIPTION OF THE PREFERRED EMBODIMENT

Figure 1:
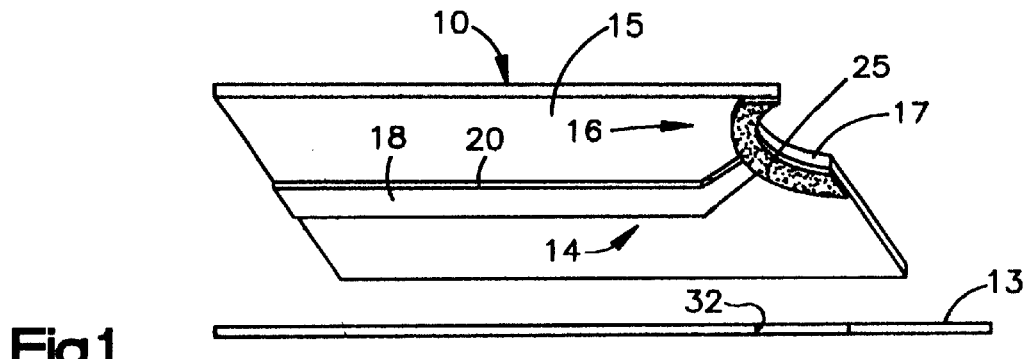
FIG. 1 is a peeled back view of a signal plane and a reference voltage plane laminated together by a sticker sheet forming a printed wiring board and having the signal lines and voltage planes selectively smooth and roughened according to the present invention.

Generally speaking, the present invention provides for signal lines on a signal plane and a reference voltage plane that are smooth on the surfaces where high frequency current is to be conducted or induced, and are rough on other surfaces to provide adhesion of the signal plane and the reference voltage plane to a sticker sheet during lamination. As indicated above, high frequency electronic applications, especially in the GHz level, drive the need for printed wiring boards to have smooth copper features. This is due to the "skin effect" wherein, as frequency is increased, the path of electrical signals tends toward the outer surface of conductors. Roughness of the outer surfaces of the copper or other conductor in such case will result in high surface resistivity and increased effective line length, both of which contribute to higher conductive losses for the signal and reduced signal speed. Conversely, in conventional printed wiring board processes, where different layers are laminated together to form a printed wiring board, often copper surfaces need a roughened condition in order to provide adequate copper to laminate adhesion in the composite structure. Thus, these two requirements appear to compete with each other in that, with high frequency, a smooth copper surface is desired whereas, to provide necessary inter-layer adhesive strength, a roughened copper surface is desired.

However, it has been found that, in fact, with respect to the signal plane, there are only a few critical areas that need to have increased copper to laminate adhesion while other areas do not have such a critical need. For example, in the areas of the plated through holes, there is a much greater need for good adhesion at the lands for the plated through holes than in the other areas of the circuit board. The intersection of a signal line or land with a plated through hole not only must survive the stresses of mechanical drilling and chemical processing, that intersection by design consists of an adhesive bond between copper to laminate, which is inherently weaker than a resin bond between laminate to laminate. Conversely, areas away from plated through holes consist of a copper to laminate bond directly over circuit lines, but are dominated by the stronger adhesive bond between laminate to laminate around the circuit traces and, moreover, these areas, of course, do not need to withstand the local stresses of drilling and processing plated through holes. Furthermore, the locations of the plated through holes represent a minor portion of the signal carrying structure of the signal plane, with the signal lines representing a major portion and, thus, the signal lines are left smooth to promote the most advantageous propagation of signals therealong. Similarly, the corresponding reference voltage plane(s) need to be maintained in a smooth condition only where the voltage plane shadows the signal lines, and can be in a roughened condition at other parts of the surface to promote good adhesion. The present invention exploits these required characteristics to provide a printed wiring board that has good signal carrying characteristics yet has the required good adhesion in the critical areas.

Figure 2:
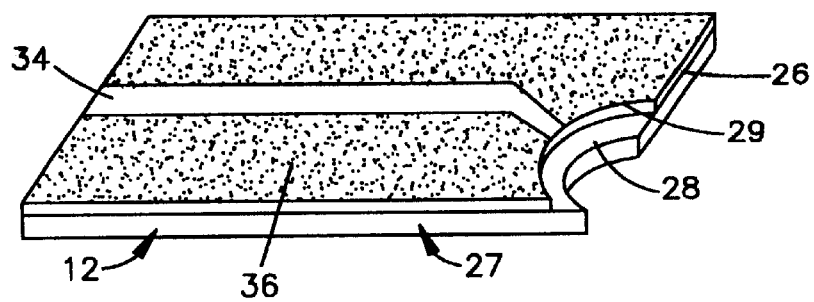
FIG. 2 is a sectional view of a composite printed wiring board formed from a signal plane and a reference voltage plane, each formed according to the present invention and as shown in FIG. 1.
Figure 3:
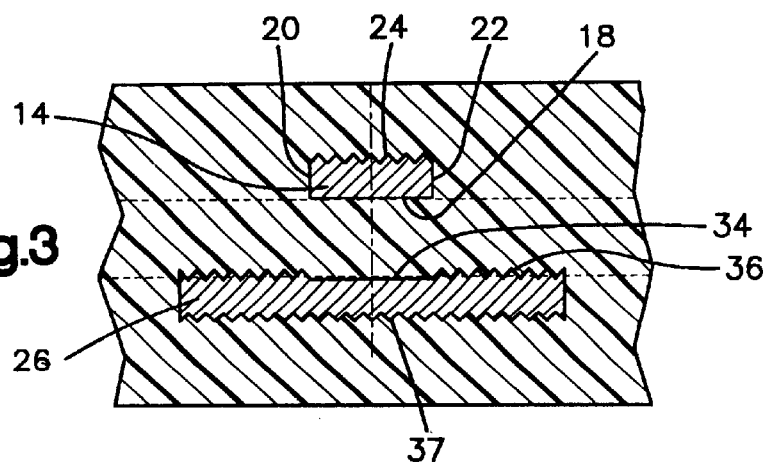
FIG. 3 is a longitudinal, sectional view taken substantially along the plane designated by line 3—3 of FIG. 2.

Referring now to FIGS. 1–3, a signal layer 10 and a reference voltage layer 12 are shown laminated together using a sticker sheet 13. The signal layer has signal lines 14 disposed on a dielectric material 15, such as FR4. (FR4 material is an epoxy coated fiberglass material well known in the art and can be laminated, if one of the laminates is in the partially cured condition, and then fully cured.) The signal lines, one of which is shown at 14, terminate at lands 16, which are disposed around openings at drilled and plated through holes, one of which is shown at 17 in the drawings. The signal lines have a top surface 18, a pair of side surfaces 20 and 22 and a bottom surface 24. (It is to be understood that "top" refers to the surface that is oriented away from the dielectric 15, the bottom surface 24 refers to the surface which is in contact with the dielectric 15, and the side surfaces 20 and 22 refer to those surfaces which connect the top and bottom surfaces 18 and 24.) The lands 16 each have a top surface 25 which is maintained in the roughened condition, whereas the top surface and preferably the side surfaces 20 and 22 of the signal lines 14 are smooth. (The roughened surfaces in this and other figures are represented by stippling or by saw-tooth shapes, when appropriate. As used herein, the term "smooth" generally refers to an $R_z$ measurement of less than about 1 micron. The term "rough" as used herein generally refers to a surface that has an $R_z$ measurement of greater than about 3 microns. Mean roughness depth $R_z$ is the arithmetic mean value of the single roughness depths $R_z$ (i), where $R_z$ (i) is the vertical distance between the highest peak and the deepest valley within consecutive sampling lengths. The terms "$R_z$" or "$R_z$(DIN)" are set forth in ASME B46.1-1995 or ISO 4287-1997.)

The reference voltage layer 12 has a copper voltage plane 26 laminated to a dielectric material 27 which, again, preferably is FR4. Opening 28 is the location of the drilled and plated through hole formed in the composite structure, and is the same plated through hole that forms opening 17 in the signal layer. In this view, the opening 28 of the drilled and plated through hole is formed in the dielectric material 27; a larger opening 29 is etched in the voltage plane 26 during initial personalization so as to form a clearance area around the plated through hole at opening 28. The sticker sheet 13 is disposed between the signal layer 10 and the reference voltage layer 12 to which the signal layer 10 and reference voltage layer 12 are laminated by conventional means. The sticker sheet also preferably is made of FR4 material and is maintained in the B cured state (partially cured) for lamination, after which the laminate is fully cured. During drilling of holes at the composite level, opening 32 is formed through sticker 13 aligning with opening 17 in dielectric 15 and opening 28 in dielectric 27 so that a continuous through opening is provided. The openings 32, 29 and 17 provide the surface for plated through hole 33 which comprises copper plated onto the dielectric materials in a conventional manner. The land 16 is in contact with the copper 33 in the openings 17, 29 and 32 to provide for a signal path. The copper plating 33 includes annular collars on opposite sides of the laminate structure. (It is to be understood that the printed wiring board shown in FIGS. 1–3 is for illustrative purposes only and that several different layers could be, and typically are, stacked but the showing only of the layers 10 and 12 illustrates the present invention.)

The voltage plane 26 has smooth surfaces 34 which shadow or are in alignment with the signal lines 14. Again, the smoothness of these areas should be less than about 1 Micron $R_z$. The majority of the surface of the voltage plane 26 is roughened as shown at 36. Thus, the lamination of the sticker sheet 13 to join the signal plane 10 and reference voltage plane 12 is enhanced by roughened surfaces 25 on the signal plane and the roughened surfaces 36 on the voltage plane 26. As shown in FIG. 3, preferably the surfaces 24 of the signal planes 14 can be rough to promote the adhesion of the signal lines 14 to the dielectric 15, and the voltage plane 26 has roughened surface 37 in contact with dielectric material 12.

Normally, in the manufactured condition, on the copper forming the signal lines 14, the surface 24 facing the dielectric material 15 is roughened; and also, in the manufactured condition, in voltage plane 26, surface 37 facing the dielectric 27 is roughened so that adhesion is already provided in the as received condition.

Thus, it can be seen that, in the laminated printed wiring board, the signal carrying surfaces of the signal lines 14, i.e. surfaces 18, 20 and 22, and the critical surface of the voltage plane, i.e. surface 34 which shadows the signal lines, are smooth to provide maximum efficiency or signal propagation, whereas the other surfaces are rough to provide for good adhesion for the lamination of the signal plane and the reference voltage plane through sticker sheet 13.

Figure 4:
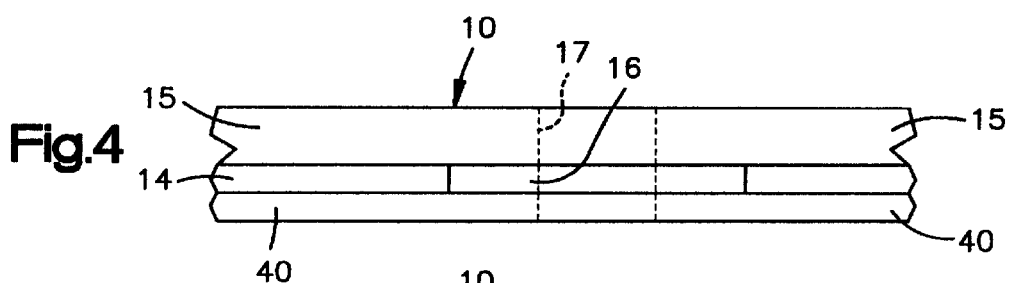
FIGS. 4–6 are representations, somewhat schematic, of the steps for forming the signal lines of a signal plane with the surface roughness of the signal lines according to the present invention.
Figure 5:
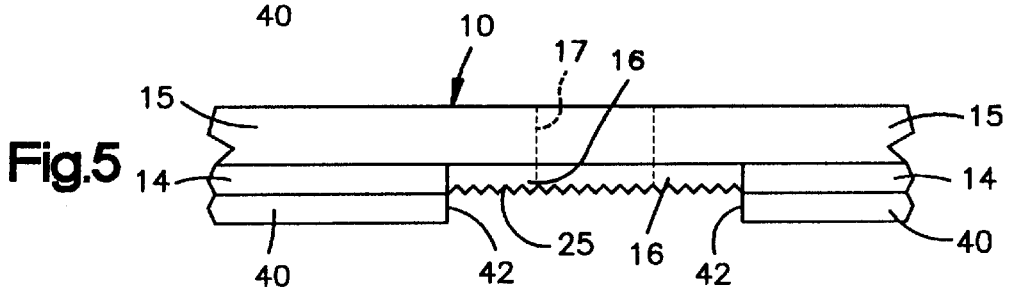
Figure 6:
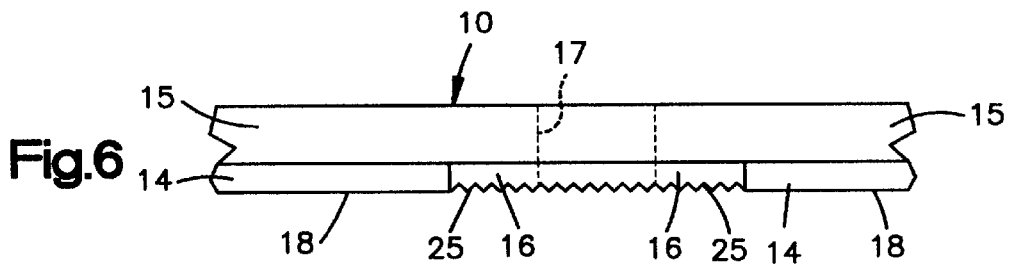
Figure 7:
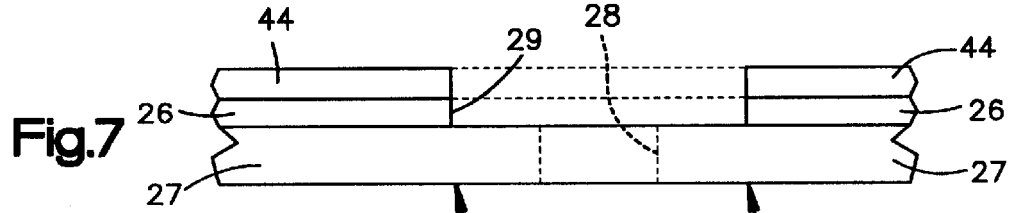
FIGS. 7–9 are schematic representations of the steps for forming the voltage plane and the reference voltage plane, the reference voltage plane having a surface roughness according to the present invention.
Figure 8:
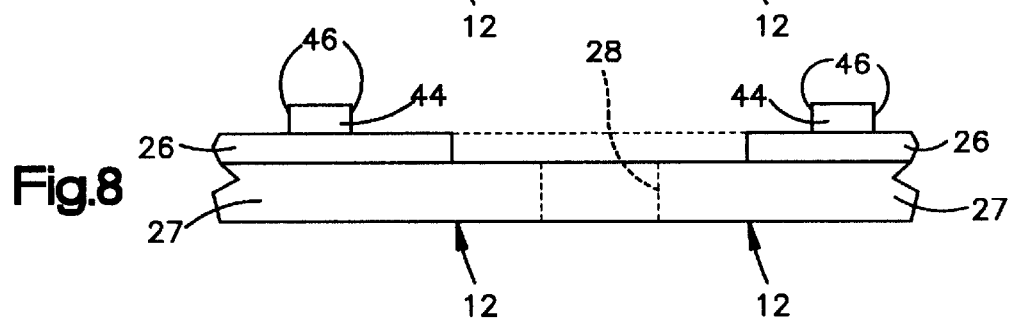
Figure 9:
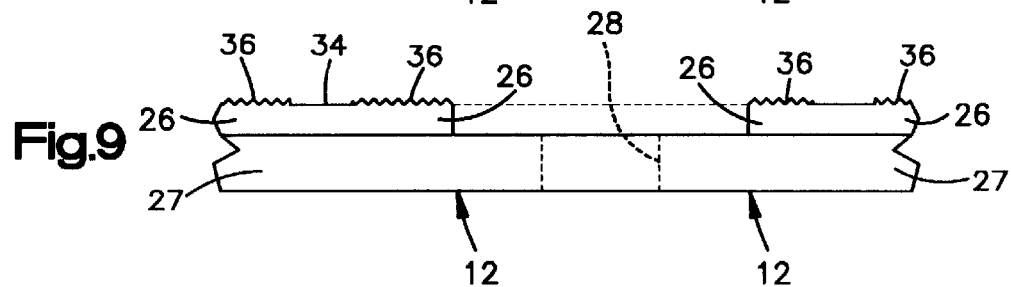

FIGS. 4–6 show somewhat diagrammatically the steps in forming the roughened surface of the signal lines 14 of signal layer 10, and FIGS. 7–9 show somewhat diagrammatically the various steps in forming the roughened surfaces 36 of the voltage plane 26. The broken lines in each figure show where an opening will be drilled.

Referring now to FIG. 4, the signal plane having the signal lines 14 formed on dielectric material 15 is provided. The dielectric material 15 preferably is a fully cured FR4 material. The entire surface of the signal lines 14 and lands 16 facing away from the dielectric 15 of the signal lines in the as-manufactured condition are generally smooth and have the required surface roughness of less than about 1 micron $R_z$. The entire surface of the signal lines is then covered with a photoresist 40. The photoresist 40 also covers the lands 16. The photoresist may be either a positive or a negative photoresist. A particularly useful photoresist is MI resist manufactured by MacDermid Co., located in Waterbury, Conn.

As shown in FIG. 5, the photoresist is exposed and that portion of the photoresist covering the lands 16 is developed away so as to leave opening 42 to expose the underlying top surface 25 of the land. It will be remembered that this surface in the as-received condition normally is smooth. The lands 16 are then roughened by any conventional means, e.g. an oxide or oxide replacement process. One particularly desirable means is by using the Bondfilm process, which is an oxide replacement process, of Atotech Co., located in Rock Hill, S.C. During this treatment, the photoresist 40 protects the signal lines 14 and especially the top surface 18 and side surfaces 20 and 22 from being roughened and, thus, they remain smooth, whereas the top surface 25 of the lands 16 are roughened and this is in a critical area, as described above. Following the roughening treatment, the photoresist is stripped in a conventional stripping solution, e.g. NaOH for most surface roughening treatments and benzyl alcohol for the oxide replacement process to provide the structure shown in FIG. 6, wherein the top surface 25 of land 16 is roughened and the top and side surfaces 18, 20 and 22 of the signal lines are maintained smooth for good current carrying properties.

FIGS. 7–9 show a similar process for roughening selected areas of the voltage plane 26. The dielectric material again preferably is fully cured FR4, with a voltage plane 26 formed thereon. The voltage plane 26 in the normally manufactured condition has a roughness of less than an $R_z$ value of 1 micron on the surface facing away from the dielectric material 27. In this technique, the voltage plane 26 is covered with a photoresist 44 after the opening 29 has been formed. Again, the photoresist is selectively exposed and the areas that are to be roughened are developed to expose the portion 36 of the voltage plane 26 through openings 46, as shown in FIG. 8. This surface portion 36 is then selectively roughened, preferably by the same process as for surfaces 25 of lands 16. The surfaces 34 which were covered by photoresist 44 are left smooth. The remaining photoresist is then stripped using a conventional stripping solution, as noted above and as shown in FIG. 9.

After the planes 10, 12 have had the roughening treatment, they are laminated using sticker sheet 13 to form a printed wiring board; the laminate is heated to fully cure the sticker sheet and, thus, the whole laminate is fully cured. The laminate is then drilled and plated in a conventional manner.

As indicated above, multiple signal planes and/or voltage planes may be, and typically are, laminated together, but only one of each is shown for illustrative purposes. In addition, dielectric materials other than FR4 may be used, such as polyimide or polytetrafluoroethylene, or others. Also, conductors other than copper may be used for either the signal lines or the voltage plane, or both, such as aluminum.

There are several techniques for selective roughening of selected surfaces, some of which include the use of photoresist techniques and some of which use a permanent masking. In another embodiment, selective roughening of the surface can also be achieved by first roughening the entire surface with the oxide or oxide replacement process or by the plating of brass, zinc or nickel or other techniques. In the case of electroplating, the entire surface is treated as foil copper prior to any personalization, then followed by circuitization to personalize signal lines or voltage clearances. In the case of electroless platings or the oxide replacement process, the treatments may be applied after circuitization, following which the photoresist is applied, and the areas to be smoothened are revealed, while the areas to remain rough are left covered. The surface treatment providing the roughness is then removed with a micro-etch strip, leaving a smooth surface. The photoresist is then stripped and two or more layers are laminated together to form the resultant composite board structure.

In still another embodiment, an additional method for selectively roughening the surface is to employ a permanent mask composed of a material compatible with the resin of the board, preferably the same resin. First, a screen mask or stencil is made using the same methods traditionally used for applying solder masks or epoxy based lettering. The resin is then screen printed through this mask onto a signal or voltage plane prepared with the desired smoothness, covering only those areas that are to remain smooth. Once printed, it is cured to a B stage. At this stage in the processing, the signal layer looks like FIG. 5 and the voltage layer looks like FIG. 8. The areas to be roughened then can be roughened by oxide or oxide replacement processes, following which the two or more layers are laminated together to form the resultant composite board structure.

What is claimed is:

1. A printed circuit structure having a dielectric layer including a signal plane with at least one set of signal lines, and signal lands surrounding a plated through hole, wherein said signal lines and lands are laminated between two sheets of dielectric material, comprising:

said signal plane including a first portion thereof having at least one surface with a first surface roughness and a second portion having at least one surface with a second surface roughness, which is greater than said surface roughness of said at least one surface of said first portion.

2. The invention as defined in claim 1 wherein said second portion of said signal plane includes at least said lands.

3. The invention as defined in claim 2 wherein the roughness of said at least one surface of said first portion of said signal plane has an $R_z$ value less than about 1 micron.

4. The invention as defined in claim 2 wherein said roughness of said at least one surface of said second portion of said signal plane has an $R_z$ value greater than about 3 microns.

5. The invention as defined in claim 2 wherein the roughness of said at least one surface of said first portion of said signal plane has an $R_z$ value less than about 1 micron, and the roughness of said at least one surface of said second portion of said signal plane has an $R_z$ value greater, than about 3 microns.

6. The invention as defined in claim 2 wherein said first portion of said signal plane has a plurality of said surfaces with a first roughness.

7. The invention as defined in claim 6 wherein said plurality of surfaces of said first portion of said signals plane include at least three surfaces.

8. The invention as defined in claim 1 wherein there is at least one voltage plane disposed in said dielectric material spaced from said signal plane; and wherein said voltage plane has a first portion with at least one surface with a first surface roughness aligned with the first portion of said signal lines, and a second portion having a first surface with a surface roughness greater than the surface roughness of said at least one surface of said first portion thereof.

9. The invention as defined in claim 8 wherein said first portion of said surface of said voltage plane has an $R_z$ value surface roughness of less than about 1 micron and said second portion of said surface of said voltage plane has an $R_z$ value of greater than about 3 microns.

* * * * *